United States Patent
Keum et al.

[11] Patent Number: 5,838,803
[45] Date of Patent: Nov. 17, 1998

[54] MUTING CIRCUIT

[75] Inventors: Dong-Jin Keum, Pucheon; Jin-Sub Choi; Duck-young Jung, both of Kyungki-do, all of Rep. of Korea

[73] Assignee: Samsun Electronics, Co., Ltd., Suwon, Rep. of Korea

[21] Appl. No.: 777,467

[22] Filed: Dec. 30, 1996

[30] Foreign Application Priority Data

Dec. 30, 1995 [KR] Rep. of Korea ............ 95-69721

[51] Int. Cl.$^6$ .................................. H04B 15/00
[52] U.S. Cl. ..................... 381/94.5; 330/51; 381/94
[58] Field of Search .................... 381/94.5, 94.1, 381/71.1; 330/51, 279, 284; 307/113, 130, 131, 141, 141.4

[56] References Cited

U.S. PATENT DOCUMENTS

Re. 32,278  11/1986  Yokota ............................ 307/130
4,390,847   6/1983   Yamada ............................ 330/51

*Primary Examiner*—Minsun Oh Harvey
*Attorney, Agent, or Firm*—Marger, Johnson, McCollom & Stolowitz P.C.

[57] ABSTRACT

There is provided a mute control circuit which is simplified to efficiently remove switching noise during the muting of each output and reducing the number of connection pins required for a given integrated circuit. The mute control circuit includes a pulse generator for receiving the each mute signal and generating a control pulse; a charge/discharge signal generator for receiving the control pulse and generating a charge/discharge signal and a switching control signal; a controller for receiving the charge/discharge signal and controlling the mute operation of the output terminal according to the switching control signal; and a switching signal generator for receiving the mute signal, generating a switching signal according to the switching control signal of the charge/discharge signal generator, and supplying the switching signal to the controller.

13 Claims, 10 Drawing Sheets

PN
CV
AA
ON
CS
PO
OP

MUTING CIRCUIT

BACKGROUND OF THE INVENTION

The present invention relates to a mute control circuit, and more particularly, to a simplified mute control circuit for use in audio electronics such as those found in television sets and stereo systems which efficiently removes switching noise when muting an output signal.

FIG. 1 shows a conventional mute control circuit S1 in a circuit having a plurality of current controlled amplifiers (CCAs) $40_1 \ldots 40 \ldots 40_n$ as output terminal amplifiers. Where a muting operation is performed, a mute signal is switched from one logic state to another using a charge/discharge signal generator 10 composed of low-pass filter (LPF), each LPF including a resistor R and a capacitor C. Charge/discharge signal generator 10 eliminates mute signal popcorn noise (POP) which results from switching the mute signal from one logic state to another.

When a plurality of CCAs are connected at the output end of the mute control circuit as shown in FIG. 1, a mute signal is controlled by inputting each mute signal $M_1, M_2, \ldots M_n$ to each mute control circuit $S_1, S_2, \ldots S_n$ and performing the above-described procedure.

The operation of the conventional mute control circuit of FIG. 1 is as follows: During a mute operation, mute signal $M_1$ shown in waveform a) in FIG. 2 is input to charge/discharge signal generator 10 resulting in voltage signal $V_{LPF}$. Voltage signal $V_{LPF}$ shown as b) in FIG. 2 undergoes a smooth transition from one logic state to another due to the charging and discharging of capacitor C in charge/discharge signal generator 10. Voltage signal $V_{LPF}$, output out of charge/discharge signal generator 10, is converted to output current $I_0$ by V/I converter 20, represented by waveform c) of FIG. 2. Output current $I_0$, in turn, is inverted by CCA controller 30 and output to the respective CCA as a slowly decreasing current $I_x$ represented by waveform d) of FIG. 2. Current $I_x$ sets CCA 40 in a mute state, eliminating high frequency electrical POP noise.

As can be gleaned from the above description, conventional mute control circuits require as many charge/discharge signal generators 10 as CCA output terminals. As a result, the number of connection pins required for a given chip increases.

SUMMARY OF THE INVENTION

An object of the present invention is to provide a mute control circuit for activating and deactivating a mute signal which reduces the number of connection pins required for chip fabrication.

Another object of the present invention is to provide a mute control circuit which can eliminate switching noise during activation and deactivation of a mute signal.

A mute control circuit is provided, comprising: pulse generating means for receiving a mute signal and generating a control pulse; charge/discharge signal generating means for receiving the control pulse and generating a charge/discharge signal and a switching control signal; controlling means for receiving the charge/discharge signal and switching signal generating means for receiving the mute signal, generating a switching signal according to the switching control signal of the charge/discharge signal generating means, and supplying the switching signal to the controlling means.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 3:
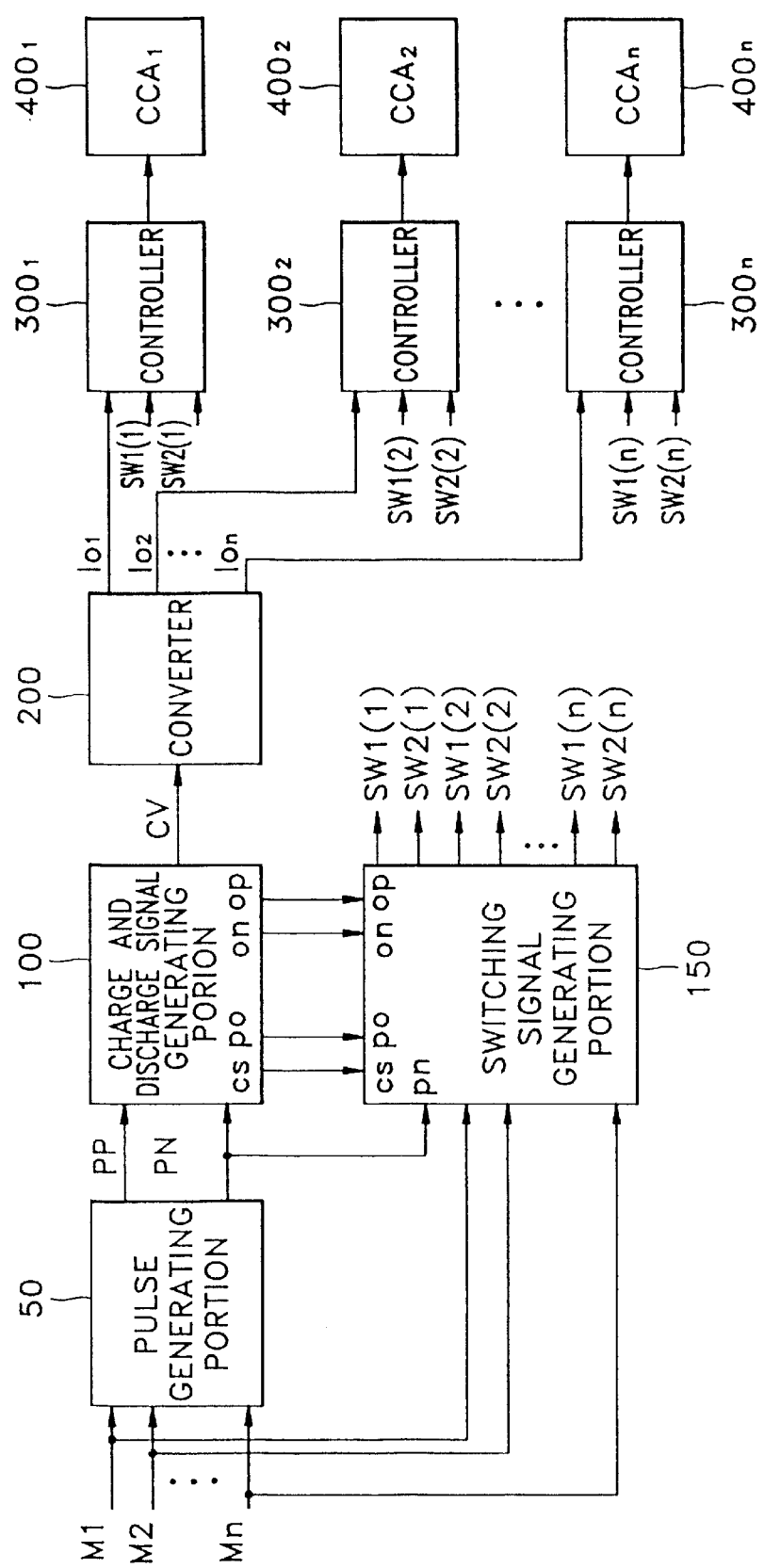
FIG. 3 is a block diagram of a mute control circuit according to the present invention.

FIG. 3 is a block diagram of a mute control circuit according to the present invention. As shown in FIG. 3, the muting operations of a plurality of CCAs $400_1$, $400_2, \ldots, 400_n$ are controlled by a single charge/discharge signal generating portion 100. The mute control circuit of the present invention includes a pulse generating portion 50 for receiving each mute signal and generating control pulses PP and PN. A charge/discharge signal generating portion 100 receives control pulses PP and PN and generates a charge/discharge signal CV and switching control signals CS, PO, ON, and OP. A V/I converter 200 is coupled to charge/discharge signal generating portion V/I converter 200 converts charge/discharge signal CV from a voltage signal to a current signal and outputs current signals $I_{o1}, I_{o2}, \ldots, I_{on}$. Controllers $300_1, 300_2, \ldots, 300_n$ receive a corresponding converted current signals $I_{o1}, I_{o2}, \ldots, I_{on}$, and control the muting operations of output terminal CCAs $400_1$, $400_2, \ldots, 400_n$. In addition, switching signal generating portion 150 receives the mute signals $M_1 \ldots M_n$ and transmits switching signals SW1(1), SW2(1), ..., SW1(n), SW2(n) to controllers $300_1, 300_2, \ldots, 300_n$.

Figure 4:
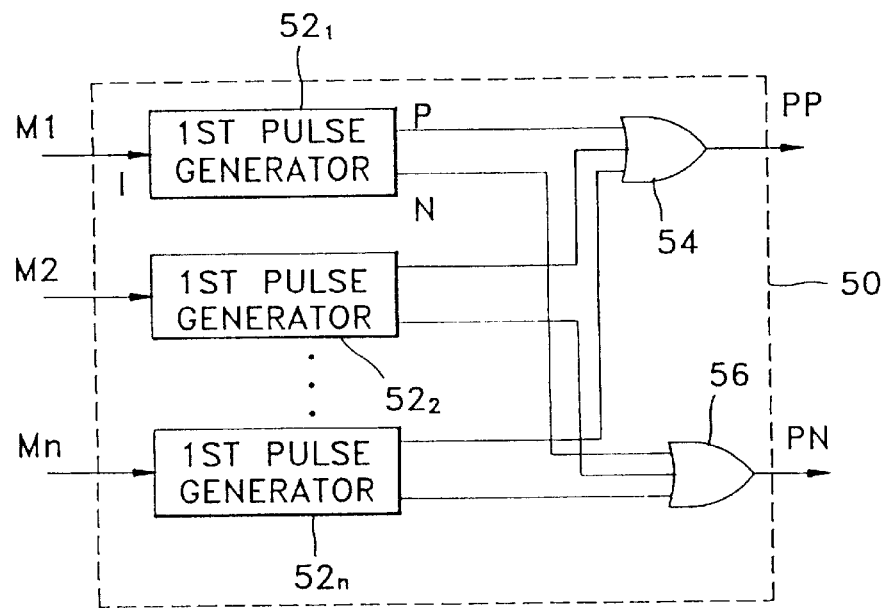
FIG. 4 is a circuit diagram of pulse generating portion 50 shown in FIG. 3.
Figure 5:
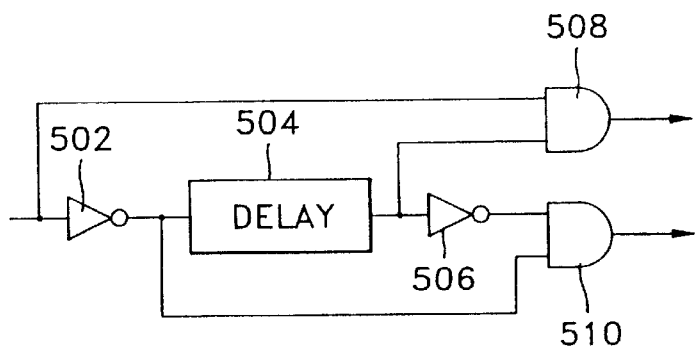
FIG. 5 is a circuit diagram of first pulse generator 52 shown in FIG. 4.
Figure 6:
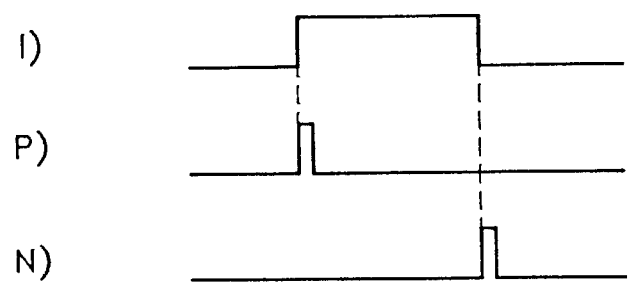
FIG. 6 is a waveform diagram illustrating the operation of the circuit shown in FIG. 5.

The operation of the mute control circuit shown in FIG. 3 is as follows. Pulse generating portion 50 receives a plurality of mute signals $M_1 \ldots M_n$ and generates pulses to be used as control signals by charge/discharge signal generating portion 100 responsive positive and negative edges of mute signals $M_1 \ldots M_n$. FIGS. 4 through 6 illustrate the operation of pulse generating portion 50 in detail, and the waveforms of signals thereof.

As shown in FIG. 4, pulse generating portion 50 includes a plurality of first pulse generators $52_1, 52_2, \ldots 52_n$ for receiving a respective mute signal $M_1 \ldots M_n$. Each of first pulse generators $52_1 \ldots 52_n$ generates a positive pulse P in response to the rising edge of mute signal $M_n$ and a negative pulse N in response to the falling edge of mute signal $M_n$. Each one of the plurality of first pulse generators $52_1, 52_2 \ldots 52_n$ are coupled to OR gate 54 and OR gate 56. OR Gate 54 receives positive pulses P from the plurality of first pulse generators $52_1 \ldots 52_n$ and produces the logic OR thereof to signal PP. Similarly, OR gate 56 receives the negative pulses N from the plurality of first pulse generator $52_1 \ldots 52_n$ and produces the logic OR thereof to signal PN. Each first pulse generator $52_1 \ldots 52_n$ receives a respective mute signal $M_1, M_2, \ldots, M_n$ as an input signal I and performs a logic AND operation at AND gate 508 of the original mute signal and an inverted delayed mute signal which passes through inverter 502 and delay 504 responsive to a positive edge of the respective mute signal Responsive to a negative edge of the respective mute signal, pulse generator 52 performs a logic AND operation at AND gate 510 of a signal which is inverted through inverter 502, delayed at delay 504, and inverted at inverter 506, and generates a negative pulse signal N.

Figure 7:
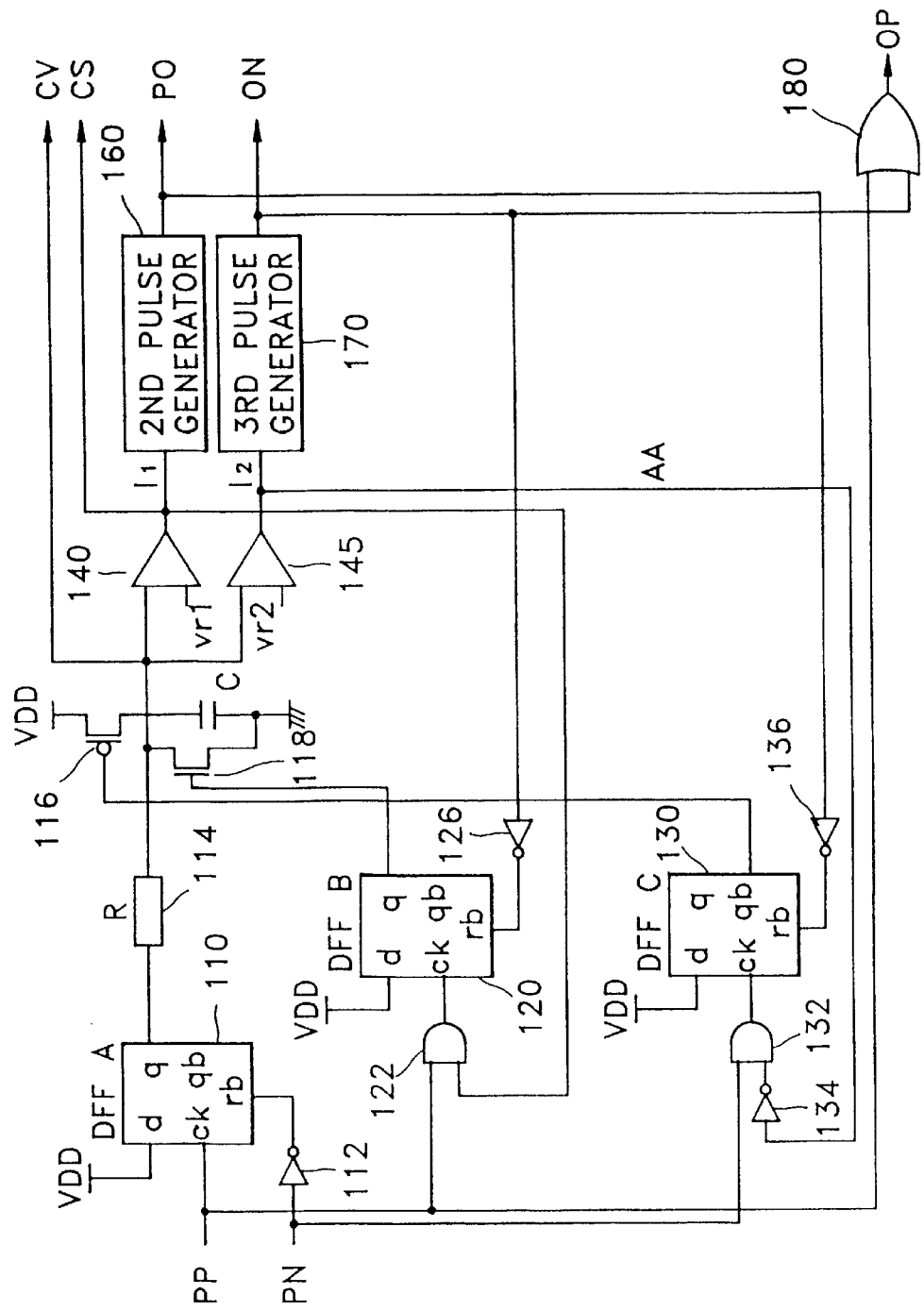
FIG. 7 is a circuit diagram of charge/discharge signal generating portion 100 shown in FIG. 3.

As shown in FIG. 7, charge/discharge signal generating portion 100 receives pulses PP and PN generated in pulse generating portion 50 of FIG. 3 and charges capacitor C during a mute-on state. In addition, charge/discharge signal generating portion 100 generates signal CV which is discharged from capacitor C during a muted state, as well as, first through fourth control signals CS, PO, ON, and OP for controlling switching signal generating portion 150.

First comparator 140 of charge/discharge signal generating portion 100 generates a logic high signal $I_1$ if the potential of capacitor C is higher than a first reference voltage vr1. Second comparator 145 generates a logic low signal $I_2$ if the potential of capacitor C is lower than a second reference voltage vr2.

Figure 14:
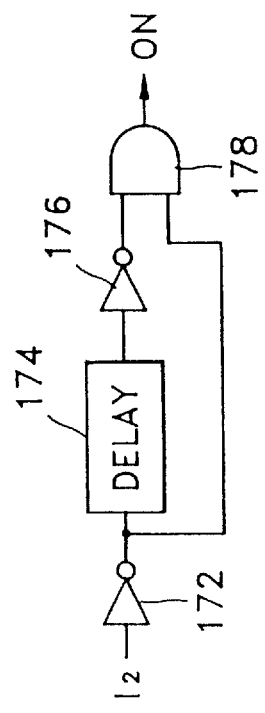
FIG. 14 is a circuit diagram of third pulse generator 170 shown in FIG. 7.
Figure 15:
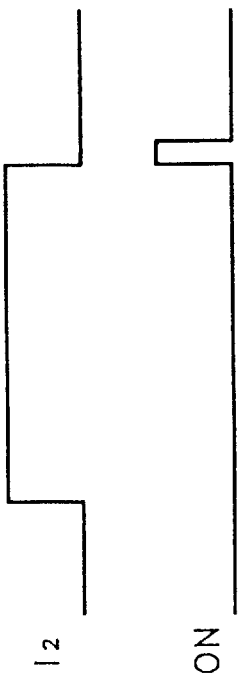
FIG. 15 is a waveform diagram illustrating the operation of the circuit shown in FIG. 14.
Figure 12:
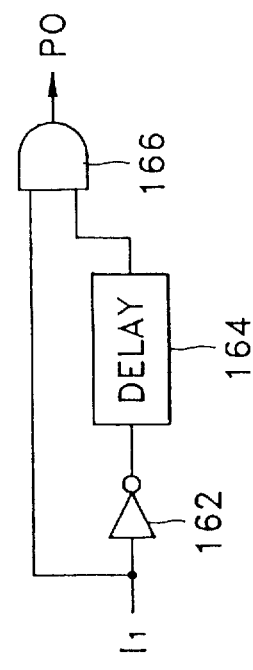
FIG. 12 is a circuit diagram of second pulse generator 160 shown in FIG. 7.
Figure 13:
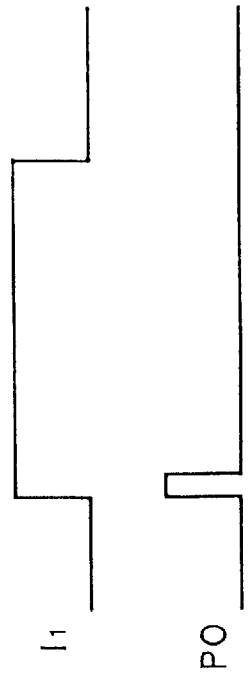
FIG. 13 is a waveform diagram illustrating the operation of the circuit shown in FIG. 12.

With reference to FIGS. 12 and 13, second pulse generator 160 of the charge/discharge generator 100 performs a logic AND operation at AND gate 166 of input signal $I_1$ and signal $I_1$ after it is inverted by inverter 162 and delayed by delay 164. The result of this operation is second control signal PO. Similarly in FIGS. 14 and 15, third pulse generator 170 performs a logic AND operation at AND gate 178 of input signal $I_2$ which is inverted by inverter 172 and input signal $I_2$ after it is delayed by delay 174 and inverted by inverter 176 to generate a third control signal ON.

The operation of charge/discharge signal generating portion 100 is as follows. When signal PP, which is generated during a positive edge of mute signal $M_n$ is input, the potential of capacitor C is larger than the first reference voltage vr1, and, thus, the output of the first comparator 140 is set to a logic high (that is, when a first control signal CS equals 1), and output Q of second flip-flop DFF B 120 is set to a logic high to thereby discharge capacitor C. If the potential of capacitor C becomes lower than second reference voltage vr2 in second comparator 145, the discharge of capacitor C is terminated by resetting second flip-flop DFF B 120 by means of an inverted signal of the third control signal ON generated in third pulse generator 170. Since the output of first flip-flop DFF A 110 is at a logic high responsive to signal PP, the potential of capacitor C is incremented according to the time constant of resistor R114 in combination with capacitor C, during the time second flip-flop DFF B 120 is reset (see FIG. 8).

Figure 9:
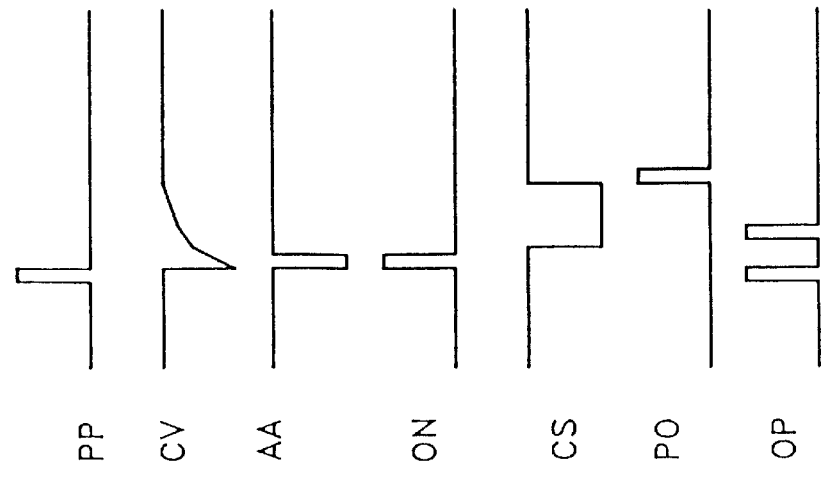
FIG. 9 is a waveform diagram illustrating the operation of the circuit shown in FIG. 7 when the output of pulse generating portion 50 is at a logic high and the output CS of first comparator is at logic low.

If the potential of capacitor C is larger than first reference voltage vr1, the output of first comparator 140 is at a logic low (CS=0) and the potential of capacitor C is incremented according to the time constant of resistor R114 and capacitor C without discharging (see FIG. 9).

Meanwhile, when pulse signal PN generated by pulse generating portion 50 during a negative edge of muted signal $M_n$, the output Q of first flip-flop DFF A 110 is set to a logic low. If the potential of capacitor C is larger than first reference voltage vr1, the output of first comparator 140 is at a logic high (CS=1) and capacitor C is charged according to the time constant formed by resistor R114 and capacitor C (see FIG. 10). When pulse signal PN generated during a negative edge of mute signal $M_n$ is input, the potential of capacitor C is larger than first reference voltage vr1, the output of the first comparator 140 is at a logic low (CS=0) and output QB of third D flip-flop DFF C 130 is set to a logic low, thereby charging capacitor C. If the charge voltage on capacitor C becomes larger than first reference voltage vr1, second signal PO is generated in second pulse generator 145 to terminate charging. Where the output Q of first flip-flop DFF A 110 is at a logic low, capacitor C is discharged according to the time constant formed by resistor R114 and capacitor C (see FIG. 11).

Figure 8:
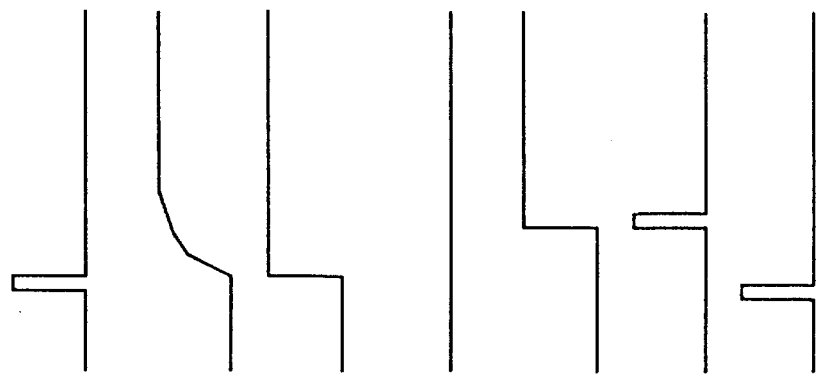
FIG. 8 is a waveform diagram illustrating the operation of the circuit shown in FIG. 7 when the output of pulse generating portion 50 is at a logic high and the output CS of first comparator is at logic high.
Figure 10:
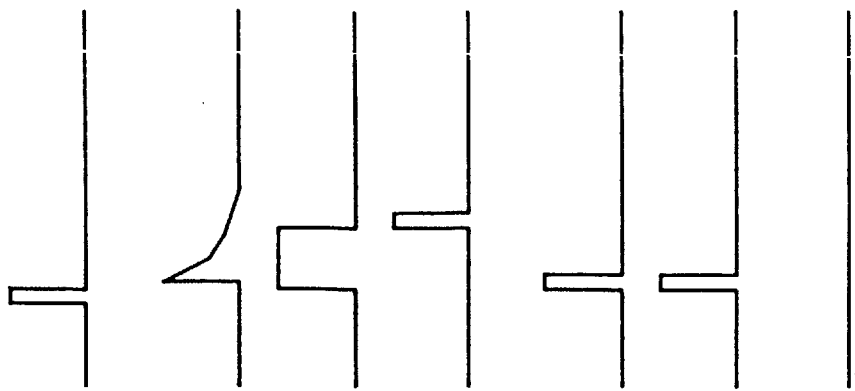
FIG. 10 is a waveform diagram illustrating the operation of the circuit shown in FIG. 7 when the output of pulse generating portion 50 is at a logic low and the output CS of the first comparator is at a logic high.
Figure 11:
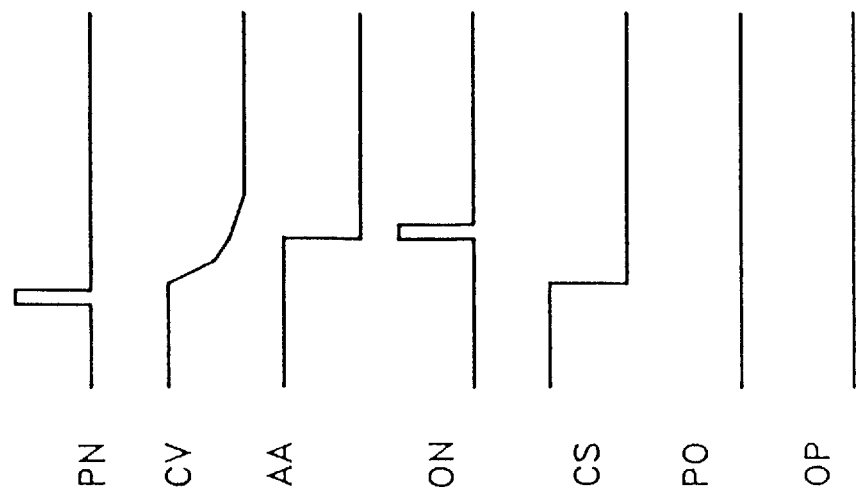
FIG. 11 is a waveform diagram illustrating the operation of the circuit shown in FIG. 7 when the output of pulse generating portion 50 is a negative pulse and output CS of the first comparator is at a logic low.

The waveforms of a series of inputs and outputs generated in the charge/discharge signal generating portion 100 are illustrated in FIGS. 8 through 11. FIG. 8 illustrates the waveforms of signals in each portion of FIG. 7 when the output of the pulse generating portion 50 of FIG. 3 is positive pulse signal PP and the output of first comparator 140 of FIG. 7, that is, the first control signal CS is at a logic high. FIG. 9 illustrates the waveforms of signals in each portion of FIG. 7 when the output of pulse generating portion 50 of FIG. 3 is positive pulse signal PP and first control signal CS is at a logic low. FIG. 10 illustrates the waveforms of signals in each portion of FIG. 7 when the output of pulse generating portion 50 of FIG. 3 is negative pulse signal PN and first control signal CS is at a logic high. FIG. 11 illustrates the waveforms of signals in each portion of FIG. 7 when the output of pulse generating portion 50 of FIG. 3 is negative pulse signal PN and first control signal CS is at a logic low. That is, charge/discharge signal generating portion 100 charges capacitor C after it has been discharged if signal PP is input and capacitor C is charged to a logic high and continues charging capacitor C if the potential thereof is low. Moreover, charge/discharge signal generating portion 100 discharges capacitor C if signal PN is input and capacitor C is low, continuing to discharge capacitor C if the potential of capacitor C is high.

Figure 16:
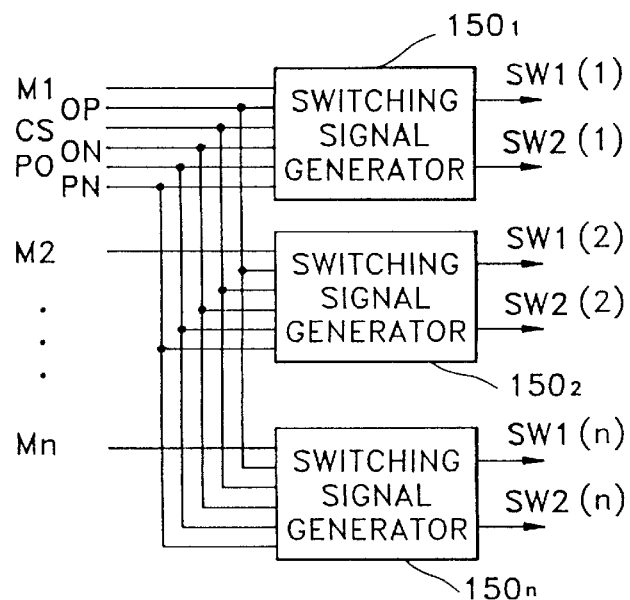
FIG. 16 is a circuit diagram of switching signal generating portion 150 shown in FIG. 3.
Figure 17:
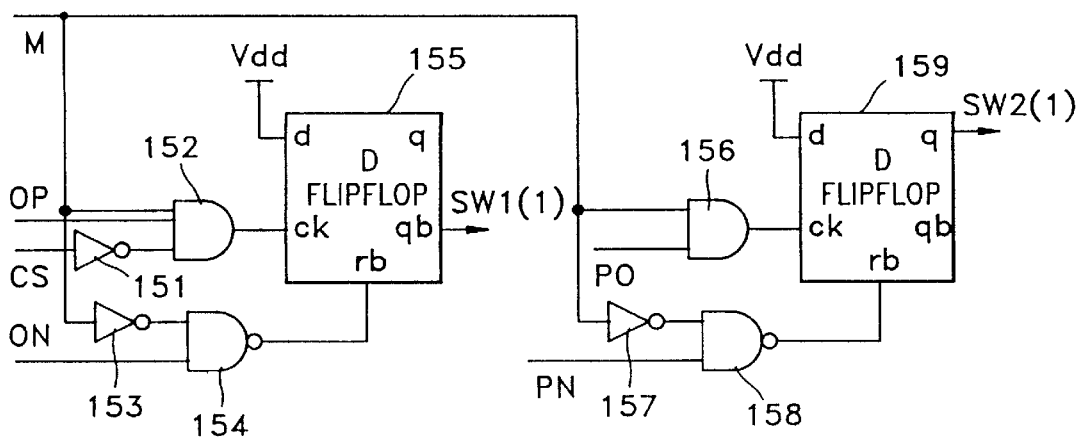
FIG. 17 is a circuit diagram of each switch shown in FIG. 16.
Figure 19:
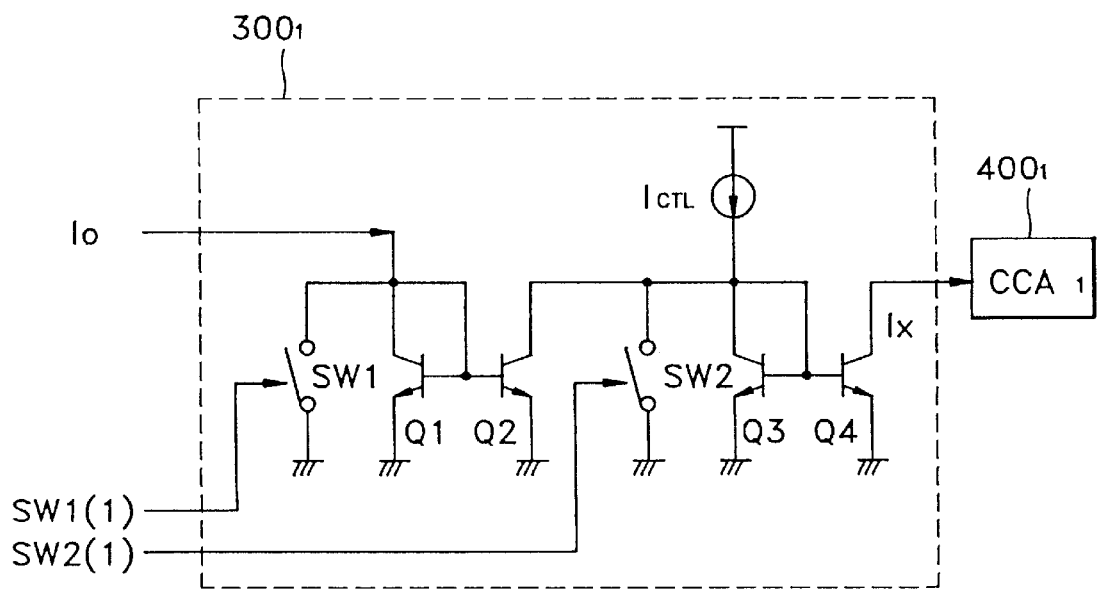
FIG. 19 is a block diagram of controlling portion $300_1 \ldots 300_n$ and current controlling and amplifying portion $400_i \ldots 400_n$ shown in FIG. 3.

Switching signal generating portion 150, shown in FIG. 19, generates switching signals SW1(1) . . . SW1(n) and SW2(1) . . . SW2(n) to control first and second switches SW1 and SW2, respectively, of controllers $300_1$, $300_2$, . . . ,$300_n$. Switching signal generating portion 150 receives mute signals $M_1$ . . . $M_n$, switching control signals CS, PO, ON, and OP of charge/discharge signal generating portion 100, pulse signal PN of pulse generating portion 50, and output control signals SW1(1) . . . SW1(n) and SW2(1) . . . SW2(n), as shown in FIGS. 16 and 17. Switching signal generating portion 150 has as many switching signal generators $150_1$, $150_2$, . . . ,$150_n$ as there are CCAs. Also, as shown in FIG. 17, each switching signal generator has D flip-flops 155 and 159 for generating switching signals by properly gating mute signals, switching control signals, and the pulse signal PN. The gating circuitry of each switching signal generator includes an inverter 151 at an input terminal of first D flip-flop 155 for inverting first control signal CS and AND gate 152 for performing a logic AND operation to the output signal of the inverter 151, a mute signal, and the fourth control signal OP, and applying the resulting value as a clock signal to first D flip-flop 155. Each switching signal generator additionally includes an inverter 153 for inverting the mute signal and a NAND gate 154 for performing a NAND operation to the output of inverter 153 and third control signal ON and applying the resulting value to a reset terminal of first D flip-flop 155. Similarly, to the input terminals of second D flip-flop 159 are applied a mute signal and second control signal PO as a clock signal via AND gate 156, and mute signal and pulse signal PN as a reset signal through inverter 157 and NAND gate 158.

Figure 18:
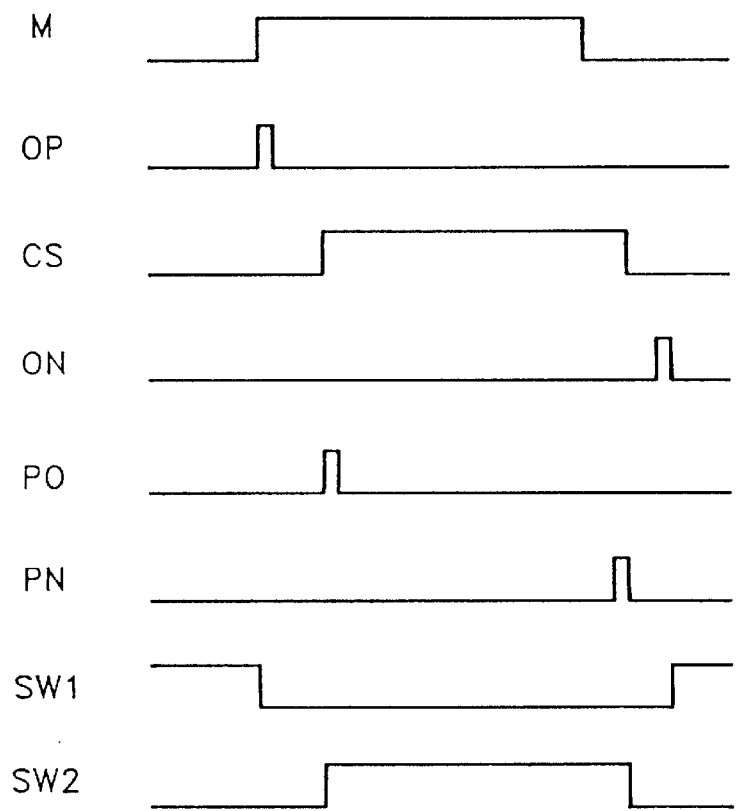
FIG. 18 is a waveform diagram illustrating the operation of the circuit shown in FIG. 17.

With reference to FIG. 18, when a mute-on signal and the fourth control signal OP are input and CS=0, first switch SW1 becomes low thereby being deactivated. When a mute-off signal and the third control signal ON are input, first switch SW1 becomes high, thereby being activated, respectively. Second switch SW2 becomes high when a mute-on signal and second control signal PO are input and second switch SW2 becomes low when a mute-off signal and pulse signal PN are input, thereby being activated and deactivated, respectively.

Figures 1, 2:
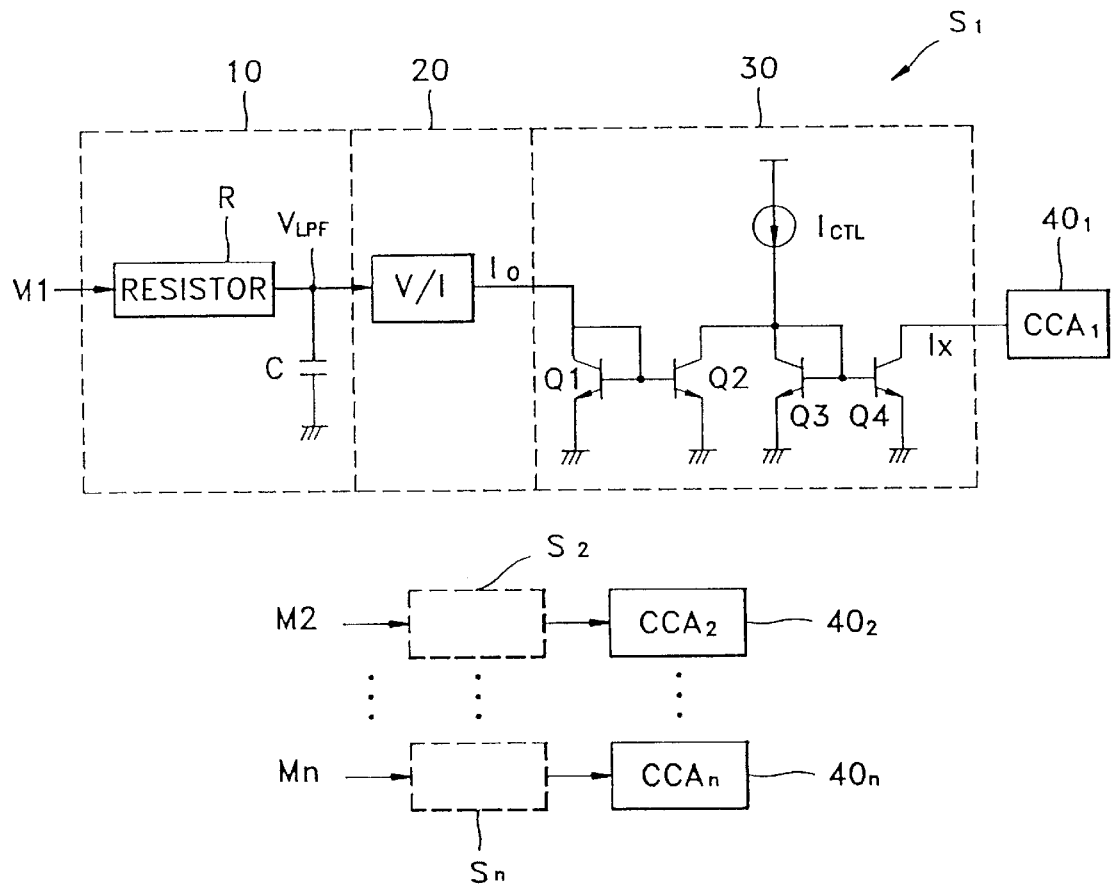
FIG. 1 is a block diagram of a conventional mute control circuit.
FIG. 2 is a waveform diagram illustrating the operation of the conventional mute control circuit of FIG. 1.

As shown in FIG. 19, controllers $300_1$, $300_2$, . . . ,$300_n$ which receive on/off signals for first and second switches SW1 and SW2 supplied from switching signal generating portion 150 and currents $I_{o1}$, $I_{o2}$, . . . ,$I_{on}$ output from V/I converter 200 are similar to the conventional controllers of FIG. 1 in constitution and operation. One difference, however, is that each CCA $400_1$ . . . $400_n$ is controlled through first and second switches SW1 and SW2.

Figure 20:
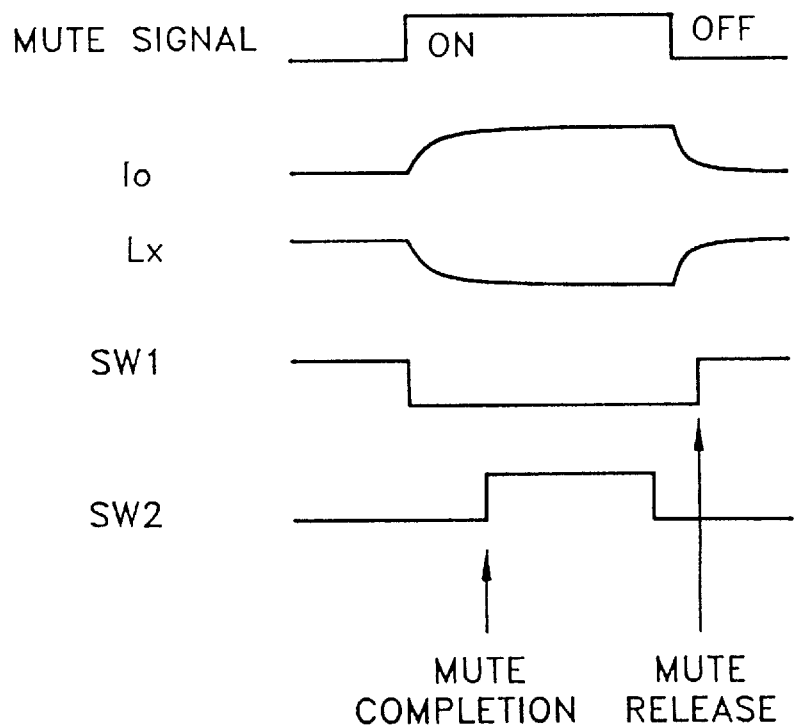
FIG. 20 is a waveform diagram illustrating the operation of the circuit shown in FIG. 19.

FIG. 20 is a waveform diagram illustrating the operation of the controller shown in FIG. 19. When a mute-on signal is input, first switch SW1 is turned off, resulting in a current path that subtracts current $I_{o1}$ from control current $I_{CTL}$. When $I_{o1}$, becomes larger than $I_{CTL}$, second switch SW2 continues the muting process by turning on without being responsive to from other mute-on/off signals. When a mute-off signal is input, second switch SW2 is turned off releasing muting and turning on first switch SW1 so that the current $I_{o1}$ is blocked without being responsive to other mute-on/off signals.

As described above, the mute control circuit of the present invention uses a single LPF to mute at least one output terminal, thereby efficiently controlling each output terminal and reducing the number of connection pins required for a given integrated chip.

What is claimed is:

1. A mute control circuit for muting at least one output terminal responsive to a plurality of mute signals received at a plurality of input terminals, the mute control circuit comprising:

pulse generating means for receiving the plurality of mute signal and generating a first and a second control pulses;

charge/discharge signal generating means for receiving the first and second control pulses and generating a charge/discharge signal and a plurality of switching control signals;

controlling means for receiving said charge/discharge signal and muting the output terminal according to the plurality of switching control signals; and switching signal generating means for receiving the plurality of mute signals, generating a plurality of switching signals responsive to said plurality of switching control signals of said charge/discharge signal generating means, and supplying the plurality of switching signals to said controlling means.

2. The mute control circuit if claim 1 further comprising voltage-to-current converting means for receiving said charge/discharge signal, converting the charge/discharge signal from a voltage signal to a current signal, and supplying the converted charge/discharge current signal to said controlling means.

3. The mute control circuit of claim 1 wherein said pulse generating means comprises:

a plurality of first pulse generators for receiving a corresponding mute signal of the plurality of mute signals, each first pulse generator generating a positive pulse signal in response to the rising edge of the corresponding mute signal and a negative pulse signal in response to the falling edge of the corresponding mute signal;

a first OR gate for logically ORing each of the positive pulse signals output from each of said plurality of first pulse generators; and a second OR gate for logically ORing each of the negative pulse signals output from each of said plurality of first pulse generators.

4. The mute control circuit of claim 3 wherein each of said plurality of first pulse generators receives a mute signal of said plurality of mute signals at an input terminal and generates the positive and the negative pulse signals, the positive pulse signal being generated by logically ANDing the mute signal and a first delayed signal, the first delayed signal being a delayed inverted version of the mute signal and the negative pulse signal being generated by logically ANDing the mute signal and a second delayed signal, the second delayed signal being a delayed version of the first delayed signal.

5. The mute control circuit of claim 1, wherein said charge/discharge signal generating means comprises;

a capacitor charged to a first voltage level during a mute-on state and discharged to a second voltage level during a mute-off state;

a first comparator for generating a logic high first comparator signal when the first voltage level of the capacitor is greater than a first reference voltage;

a second comparator for generating a logic low second comparator signal when the voltage potential of the capacitor is less than a second reference voltage;

second and third pulse generators for receiving the first and second comparator signals and generating a first and second control signals; and an OR gate for receiving the second control signal and the first control pulse and generating a third control signal.

6. The mute control circuit of claim 5 wherein said second pulse generator includes a first AND gate for producing the first control signal by logically ANDing the first comparator signal with an inverted and delayed version of the first comparator signal.

7. The mute control circuit of claim 6 wherein said third pulse generator includes a second AND gate for producing the second control signal by logically ANDing the second comparator signal with an inverted and delayed version of the second comparator signal.

8. The mute control circuit of claim 5 wherein said charge/discharge signal generating means further comprise:

a first D flip-flop for discharging said capacitor responsive to the first control pulse discharging process and ending the responsive to the second control signal;

a second D flip-flop for discharging said capacitor according to a time constant responsive to the first control pulse; and a third D flip-flop for charging said capacitor responsive to the second control pulse and ending the charging process responsive to the first control signal.

9. The mute control circuit of claim 1 wherein said switching signal generating means comprises a plurality of switching signal generators, each switching signal generator having a plurality of input terminals for receiving a corresponding mute signal of the plurality of mute signals and comprising:

first and second gating means for gating the corresponding mute signal with the third control signal and a chip select signal and with the first control signal, respectively, and generating a first and second clock signals, respectively;

third and fourth gating means for gating the corresponding mute signal with the second control signal and the second control pulse and generating a first and second reset signal;

a first D flip-flop for generating a corresponding first switching signal at an output terminal, said first D flip-flop having a first clock terminal for receiving a first clock signal from said first gating means and a first reset terminal for receiving a first reset signal; and a second D flip-flop for generating a corresponding second switching signal at an output terminal, said second D flip-flop having a second clock terminal for receiving a second clock signal from said second gating means and a second reset terminal for receiving a second reset signal.

10. The mute control circuit of claim 1 wherein said first gating means is a first AND gate, said second gating means is a second AND gate, said third gating means is a first NAND gate, and said fourth gating means is a second NAND gate.

11. The mute control circuit of claim 2 wherein said controlling means comprises first and second switches for receiving the plurality of switching signals from said switching signal generating means and outputting said switching signals to the output terminal.

12. The mute control circuit of claim 11, wherein said charge/discharge signal generating means discharges a capacitor when the capacitor has a logic high potential and a mute signal is in a logic high state, and charges the capacitor when the capacitor has a logic low potential and the mute signal is in a logic low state.

13. A method for muting an output terminal comprising the steps of:

generating a first and second control pulses responsive to a plurality of mute signals;

generating a charge/discharge signal and a plurality of switching control signals responsive to the first and second control pulses;

controlling the mute operation of the output terminal responsive to the plurality of switching control signals;

generating a plurality of switching signals responsive to the plurality of switching control signals; and supplying the plurality of switching signals to said controlling step.

* * * * *

UNITED STATES PATENT AND TRADEMARK OFFICE
CERTIFICATE OF CORRECTION

PATENT NO.    : 5,838,803
DATED         : November 17, 1998
INVENTOR(S)   : Keum et al.

It is certified that error appears in the above-identified patent and that said Letters Patent is hereby corrected as shown below:

<u>Column 6,</u>
Line 23, "if claim 1" should read -- of claim 1 --.

Signed and Sealed this

Twenty-third Day of April, 2002

Attest:

JAMES E. ROGAN
*Attesting Officer*    *Director of the United States Patent and Trademark Office*